(12) United States Patent
Vetter

(10) Patent No.: US 8,309,235 B2
(45) Date of Patent: Nov. 13, 2012

(54) MULTILAYER FILM-COATED MEMBER AND METHOD FOR PRODUCING IT

(75) Inventor: Jörg Vetter, Bergisch-Gladbach (DE)

(73) Assignee: Sulzer Metaplas GmbH, Bergisch-Gladbach (DE)

( * ) Notice: Subject to any disclaimer, the term of this patent is extended or adjusted under 35 U.S.C. 154(b) by 284 days.

(21) Appl. No.: 12/511,464

(22) Filed: Jul. 29, 2009

(65) Prior Publication Data

US 2010/0028636 A1    Feb. 4, 2010

(30) Foreign Application Priority Data

Jul. 31, 2008 (EP) ................................. 08161531

(51) Int. Cl.
*B32B 9/00* (2006.01)

(52) U.S. Cl. ...... 428/697; 51/307; 51/309; 204/192.15; 204/192.16; 428/698; 428/699; 428/704

(58) Field of Classification Search ................... 428/697, 428/698, 699, 704; 204/192.15, 192.16; 51/307, 309
See application file for complete search history.

(56) References Cited

U.S. PATENT DOCUMENTS

| 6,296,928 | B1 * | 10/2001 | Yamada et al. | 428/697 |
| 6,586,122 | B2 * | 7/2003 | Ishikawa et al. | 428/699 |
| 7,166,155 | B2 * | 1/2007 | Ishikawa | 428/697 |
| 7,348,074 | B2 * | 3/2008 | Derflinger | 428/699 |
| 7,410,707 | B2 * | 8/2008 | Fukui et al. | 428/699 |
| 7,504,149 | B2 * | 3/2009 | Toihara et al. | 428/697 |
| 7,935,426 | B2 * | 5/2011 | Vetter | 428/698 |

FOREIGN PATENT DOCUMENTS

| EP | 1783245 A | 5/2007 |
| JP | 2000-297365 | * 10/2000 |
| JP | 2007 126714 A | 5/2007 |

OTHER PUBLICATIONS

Hegemann et al "PACVD_Derived Thin Films in the System Si-B-C-N" Chemical Vapor Depostion vol. 5, Issue 2, Mar. 1999, p. 61-65.*

European Search Report for Patent Application 08161531.2, Jan. 5, 2009.

* cited by examiner

*Primary Examiner* — Archene Turner

(74) *Attorney, Agent, or Firm* — Robert S. Green

(57) ABSTRACT

A multilayer film-coated member is fabricated by coating the surface of a substrate with at least two hard coating films having different compositions, wherein the first composition hard film of the outermost layer is represented by $Si_aB_bN_cC_dO_e$ with $a+b+c+d+e=1$, $0.1 \leq a \leq 0.5$, $0.01 \leq b \leq 0.2$, $0.05 \leq c \leq 0.6$, $0.1 \leq d \leq 0.7$ and $0 < e \leq 0.2$, the second composition hard coating film having at least two selected from Al. Ti, Cr, Ni, Ce. Mg, Nb, W, Si, V, Zr and Mo and N and at least one selected from B, C, O and S and the oxygen content of the film at least 25 nm from the interface of the first composition hard coating film that is in contact with the underlying layer toward the surface of the first composition hard coating film is limited to a range of less than 3.5 atm. %.

15 Claims, 3 Drawing Sheets

MULTILAYER FILM-COATED MEMBER AND METHOD FOR PRODUCING IT

CROSS-REFERENCE TO RELATED APPLICATIONS

Figure 1:
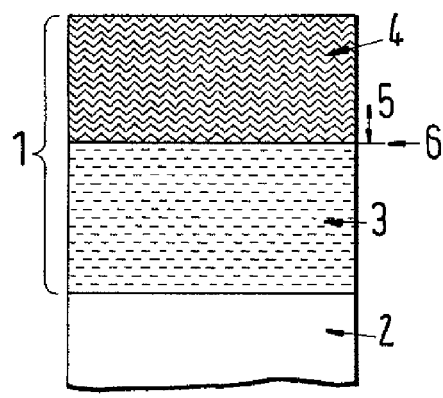

The present application claims priority under 35 U.S.C. §119 of European Patent Application No. 08161531.2 filed on Jul. 31, 2008, the disclosure of which is expressly incorporated by reference herein in its entirety.

BACKGROUND OF THE INVENTION

1. Field of the Invention

The present invention relates to a multilayer film-coated member fabricated by forming a multilayer film on a substrate for abrasion-resistant members for cutting tools, molds and combustion engines or for members requiring heat resistance and abrasion resistance for airplanes, ground turbines, engines, gaskets, gears, pistons and others, and relates to a method for producing it.

2. Background Art

For the purpose of improving the heat resistance and abrasion resistance of coating films, development of various coating films is being promoted. With reference to typical cases of Patent References 1 to 3, described is one example of a process of development of coating films essentially for the purpose of improving the heat resistance and abrasion resistance of coating films. For the purpose of improving the heat resistance, many trials to coat heat-resistant materials have heretofore been made. For example, in Patent Reference 1, proposed is a coating film with oxides of Y and Si dispersed in a glassy matrix comprising $SiO_2$ and $B_2O_3$. This is an invention of a heat-resistant coating film with Si. However, the abrasion resistance of the film is not improved, and therefore it is difficult to apply the film to tools and slide members. In Patent Reference 2, proposed is a (TiAl(SiC))N coating film formed by the use of a target material with SiC powder having excellent heat resistance and abrasion resistance, for the purpose of improving the heat resistance and the abrasion resistance of TiAlN coating films widely used in the market. Accordingly, as compared with a TiAlN coating film, the (TiAl(SiC))N coating film has improved heat resistance and abrasion resistance, but since the base of the film is TiAlN, the effect of the improvement is limited. For further improving the abrasion resistance and the heat resistance, the present applicant has proposed a Si(BCN)-based coating film described in Patent Reference 3. Accordingly, the abrasion resistance and the heat resistance of coating films for use for cutting tools and abrasion-resistant members have been greatly improved.

Patent Reference 1: JP-A 2002-87896
Patent Reference 2: Japanese Patent 3370291
Patent Reference 3: JP-A 2007-126714

For example, in the field of cutting work, the objects to be cut are being more difficult to cut and the working time is being much shortened for more rapid cutting speed and more rapid feeding of objects. With these requirements, cutting tools are forced to be exposed too much severer working environments than before. Given the situation, the applicant of the present invention has proposed a coating film having excellent abrasion resistance and heat resistance as in Patent Reference 3. In one application example of the coated member of the invention of Patent Reference 3, a cutting tool with the coating film was tested and evaluated for its cutting capability, which confirmed more excellent performance of the tool over conventional cases. However, in order that the coated member could be applicable to further severer cutting conditions, it has been known that the adhesion strength of the coating film must be more improved.

SUMMARY OF THE INVENTION

An object of the present invention is to provide a multilayer film-coated member which has both sufficient heat resistance and sufficient abrasion resistance and which has excellent coating film adhesion strength so that it can sufficiently exhibit the capability of the coating film even in cutting environments that may be more and more severe.

The invention is a multilayer film-coated member fabricated by coating the surface of a substrate with at least two hard coating films having different compositions, wherein the first composition hard film of the outermost layer of the hard coating films represented by $Si_aB_bN_cC_dO_e$ with $a+b+c+d+e=1$, $0.1 \leq a \leq 0.5$, $0.01 \leq b \leq 0.2$, $0.05 \leq c \leq 0.6$, $0.1 \leq d \leq 0.7$ and $0 < e \leq 0.2$, the second composition hard coating film of the lower layer below the first composition hard coating film having at least two selected from Al, Ti, Cr, Ni, Ce, Mg Nb, W, Si, V, Zr and Mo and N and at least one selected from B, C, O and S and the oxygen content of the film within a range of at least 500 nm from the interface of the first composition hard coating film that is in contact with the underlying layer toward the surface of the first composition hard coating film is limited to a range of less than 5 atm. %.

In the multilayer film-coated member of the invention, the ratio of the peak area X of B—O to the peak area Y of B—N, XY, as obtained from the peak separation of the is orbit of B in X-ray photoelectric spectrometry, may be $X/Y \leq 0.2$, within a range of at least 500 nm from the interface of the first composition hard coating film that is in contact with the underlying layer toward the surface of the first composition hard coating film. The oxygen distribution control in a specific region of the hard coating film remarkably improves the adhesion strength of the hard coating film having both excellent heat resistance and excellent abrasion resistance.

Figure 2:
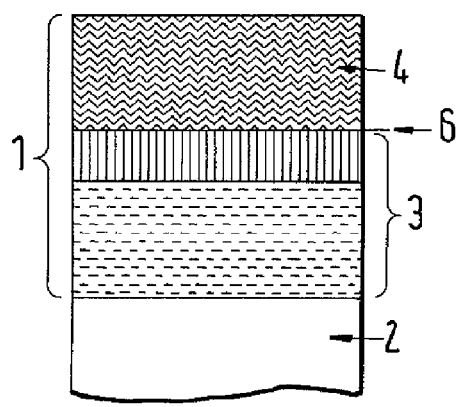
Figure 3:
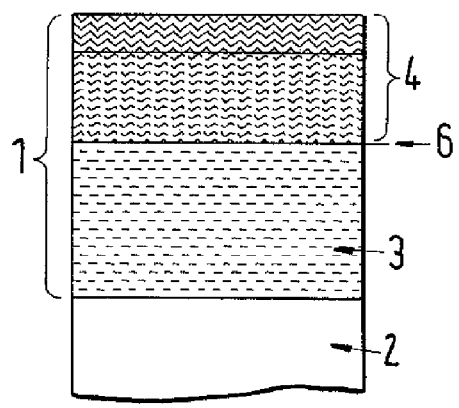
Figure 4:
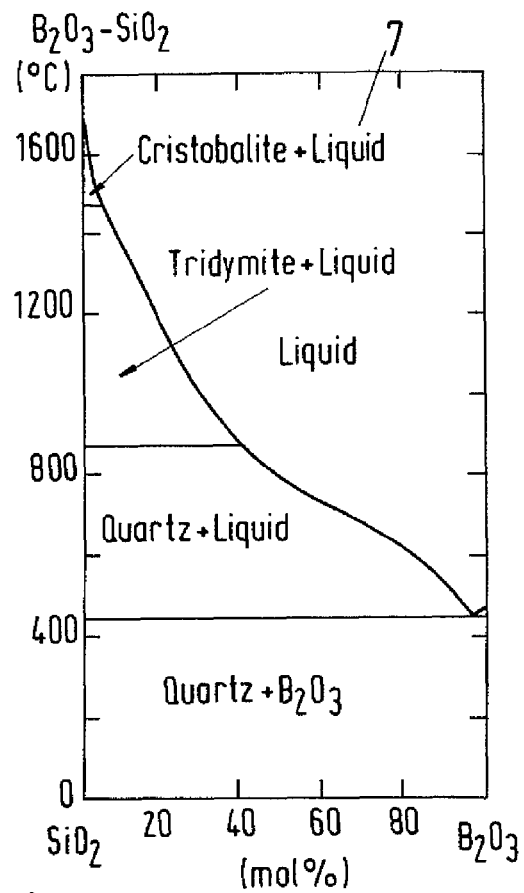
Figure 5:
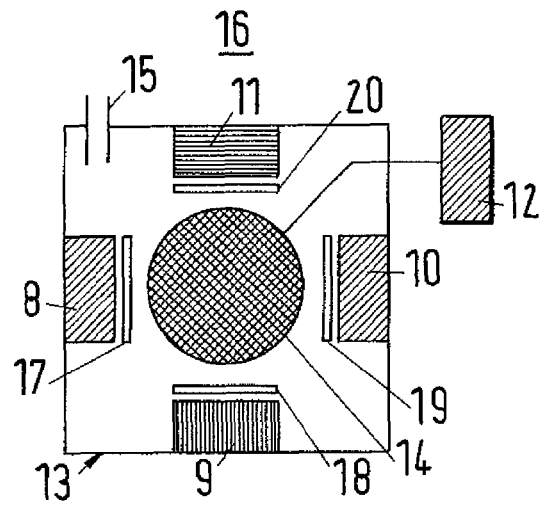
Figure 6:
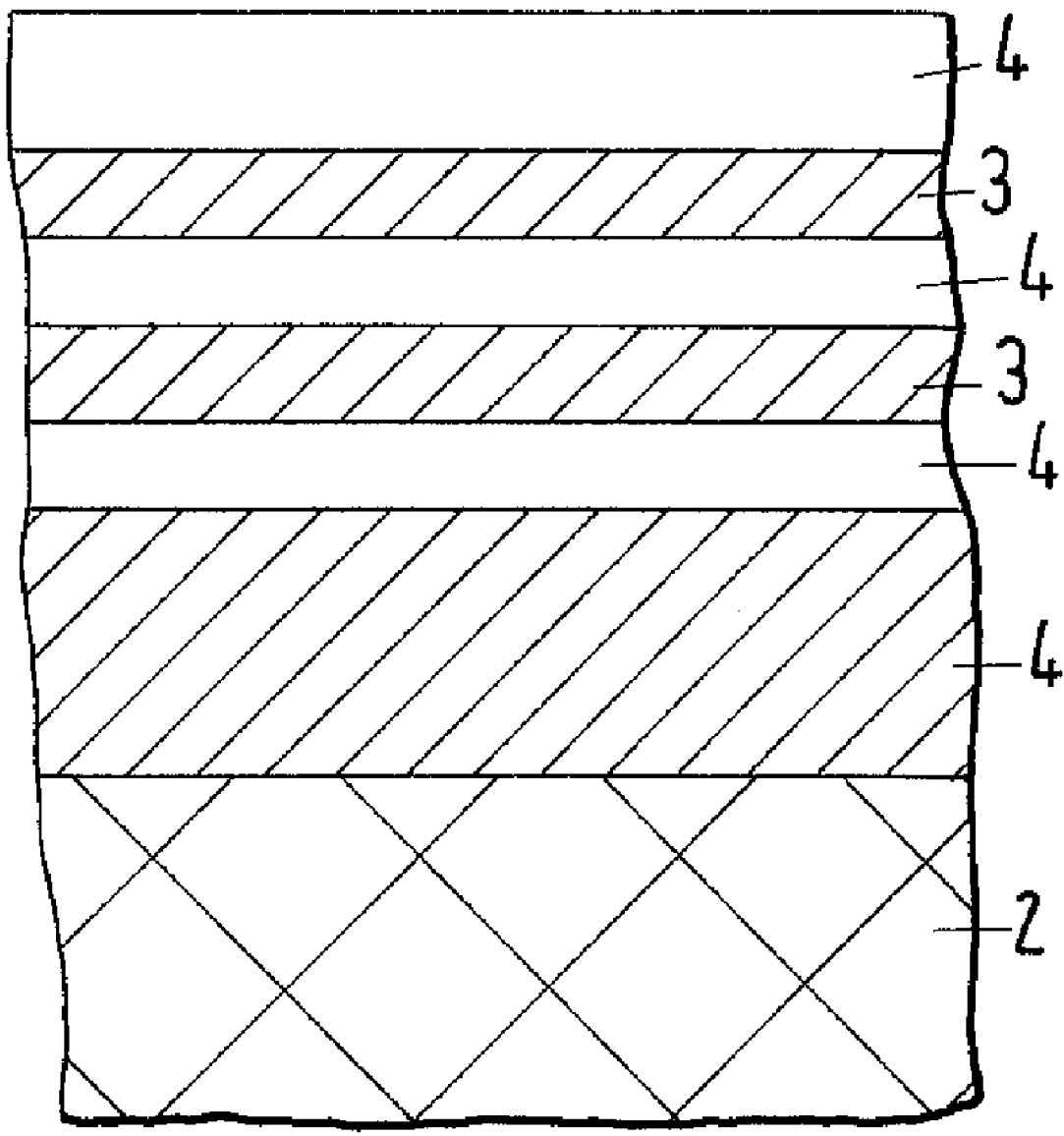

In the following the invention is described in more detail with the help of the drawings which show:

FIG. 1: partial constructional example of a multilayer film-coated member having two hard coating films;

FIG. 2: schematic illustration of coating structure in case of the second composition hard coating film has a double layer structure;

FIG. 3: schematic illustration of coating structure in case of the first composition hard coating film has a double layer structure;

FIG. 4: B2O3-SiO2 binary phase diagram by T. J. Rocket and W. R. Foster, J. Am. Ceram. Soc., 48 [2] 78 (1965);

FIG. 5: schematic illustration of structure of a coating machine;

FIG. 6: a preferred embodiment of a multi layer film-coated member according to the invention.

FIG. 1 shows a partial constructional example of a multilayer film-coated member having two hard coating films of the invention. In FIG. 2, a multilayer film-coating member 1 comprises a second composition hard coating film 3 and a first composition hard coating film 4 laminated in that order on a substrate 2 of a cutting tool or an abrasion-resistant member. The above-mentioned "range of at least 500 nm from the interface of the first composition hard coating film that is in contact with the underlying layer toward the surface of the first composition hard coating film" is described with reference to FIG. 1. The underlying layer is the layer that is in contact with the first composition hard coating film, and in the case of FIG. 1, this is the second composition hard coating film 3. However, in some use, an interlayer may be provided between the second composition hard coating film and the first composition hard coating film; and in such a case, the underlying layer is the interlayer that is in contact with the first composition hard coating film. The interface is that between the first composition hard coating film and the underlying layer, and this is the area indicated by 6 in FIG. 1. The "range of at least 500 nm from the interface toward the surface of the first composition hard coating film" is the range indicated by 5 in FIG. 1, and this is a range in the first composition hard coating film that runs toward the surface of the first composition hard coating film starting from the interface 6. The range of 5 in FIG. 1 is at least 500 nm; and the multilayer film-coating member is characterized in that the oxygen content of the first composition hard coating film within that range is limited to a range of less than 5 atm. %. Other examples of the coating film structure are shown in FIG. 2 and FIG. 3. In FIG. 2, the second composition hard coating film has a double-layer structure; and in FIG. 3, the first composition hard coating layer has a double-layer structure. Apart from these, another example of the invention may be mentioned in which both the first composition hard coating layer and the second composition hard coating layer have a double-layer structure.

Within the range of at least 500 nm from the interface of the first composition hard coating film that is in contact with the underlying layer toward the surface of the first composition hard coating film in the multilayer film-coated member of the invention, the ratio of the peak area X of B—O to the peak area Y of B—N, X/Y, as obtained from the peak separation of the is orbit of B in X-ray photoelectric spectrometry, may be X/Y≦0.2. The ratio limitation is because, when a large quantity of B oxide exists near the interface, then the reduction in the adhesion strength is remarkable, and therefore, the presence of B oxide in the interface must be limited to less than a predetermined level.

The multilayer film-coated member that is coated with hard coating films of the invention may have improved heat resistance of the coating films and may prevent the member from being abraded more by temperature elevation, and in addition, the lubricative characteristics of the multilayer coating film of the member can be improved therefore preventing the adhesion of work materials to the cutting tools. The most characteristic feature of the invention is that the multilayer film-coated member may have significantly improved adhesion strength while still having the above-mentioned characteristics as such. Because of this effect, the coating film may exhibit its excellent capability stably for a long period of time. The effect of the invention in practical use is demonstrated in coating of cutting tools. The cutting tools coated according to the invention may exhibit excellent heat resistance and abrasion resistance with the excellent adhesion strength of the coating films kept ensured as such, and therefore, they may be applicable to high-speed and rapid-feed cutting work. In cutting hardly-cuttable materials, there may happen some sudden accidents to be caused by adhesion of work materials to cutting edges; however, the multilayer film-coated member of the invention having excellent adhesion strength and excellent lubricity may evade such accidents. The method for producing the multilayer film-coated member of the invention is favorable for forming the coating film having the above-mentioned characteristics.

DESCRIPTION OF THE PREFERRED EMBODIMENTS

The multilayer film-coated member of the invention comprises at least two hard coating films having different compositions formed on the surface of a substrate, in which the hard coating films are at least a first composition hard coating film and a second composition hard coating film, the first composition hard coating film represented by $Si_aB_bN_cC_dO_e$ with a+b+c+d+e=1, $0.1 \leq a \leq 0.5$, $0.01 \leq b \leq 0.2$, $0.05 \leq c \leq 0.6$, $0.1 \leq d \leq 0.7$ and $0 < e \leq 0.2$, the second composition hard coating film having at least two selected from Al, Ti, Cr, Ni, Ce, Mg Nb, W, Si, V, Zr and Mo and N and at least one selected from B, C, O and S and the oxygen content of the film within a range of at least 500 nm from the interface of the first composition hard coating film that is in contact with the second composition hard coating film toward the surface of the first composition hard coating film is limited to a range of less than 5 atm. %. Please note that in the scope of the present patent application "atm %" or "at %" always means "atomic %".

One preferred laminate structure of the invention is shown in FIG. 1. The constitution of the hard coating film 1 of the invention comprises a second composition hard coating film 3 and a first composition hard coating film 4 as formed on the surface of a substrate 2. The thickness of the second composition hard coating film may be from 100 nm to less than 5000 nm, more preferably from 100 nm to less than 3000 nm. The thickness of the first composition hard coating film may be from 10 nm to less than 1000 nm, more preferably from 40 nm to less than 600 nm. The main role of the second composition hard coating film in the invention is to act as assistance for the first composition hard coating film so that the first film may sufficiently exhibit its advantages of abrasion resistance and heat resistance. Specifically, the ratio of the film thickness of the first composition hard coating film to the overall film thickness could not increase from the viewpoint of the residual compression stress of the film, and in such a case, the second composition hard coating film is made thick. A preferred thickness ratio of the first composition hard coating film and the second composition hard coating film is such that, when the overall thickness is considered 100, the ratio of the first composition hard coating film is from 2% to 50%. In order that the first composition hard coating film could sufficiently exhibit its characteristics, the adhesion strength of the second composition hard coating film to the substrate surface, and the hardness and the residual compression stress thereof are important factors. In this, for example, the substrate 2 may be any of cemented carbide, cermet, high-speed steel, sintered boron nitride, ceramics, mold steel, heat-resistant alloy. The cutting tools are, for example, end mill, drill, reamer, broach, hob cutter, microdrill, router, milling insert, turning insert. The heat-resistant alloy includes titanium alloy, Inconel, aluminium alloy.

The first composition hard coating film in the invention comprises Si, B, C, N and O as the indispensable ingredients so as to satisfy its characteristics of abrasion resistance and heat resistance. In this, however, Si, B and C are elements that readily form oxides. Therefore, the coating film may readily take thereinto the impurity oxygen in the chamber of coating machine or in a process gas and the oxides in the surface of a coating target. In this connection, it is well known in the state of the art to increase the pumpage as well as to bake out the process chamber in order to further reduce the oxygen content in the process chamber. Moreover, it is well known to use highly purified gases to reduce the amount of oxygen of the process gases within the chamber. In particular, when the above oxides are formed on the surface of the substrate in the initial stage of the film-forming process, then the adhesion strength may greatly lower. Accordingly, in the invention, the oxide take-in amount in the initial stage in the film formation of the first composition hard coating film must be controlled.

Of the elements constituting the film, Si and B oxides have significant influences on the reduction of the adhesion strength of the film. A typical oxide of Si $SiO_2$ is stable up to 1700° C. or so; but a typical oxide of B, $B_2O_3$ liquefies at 500° C. or so, as is known from the $B_2O_3$—$SiO_2$ binary phase diagram of FIG. 4. Further, $SiO_2$ and $B_2O_3$ undergo eutectic reaction, and form a eutectic flux at about 450° C. Specifically, when oxides are formed on the surface of the substrate in the initial stage of the film formation of the first composition hard coating film and when the substrate temperature exceeds over 450° C. by heating during the film formation, then flux may be formed to lower the adhesion strength. Accordingly, when the first composition hard coating film is formed, it is important to control the substrate temperature so as not to be higher than the eutectic temperature of $SiO_2$ and $B_2O_3$. For example, the film formation is attained with monitoring the temperature of the substrate, and the film-forming temperature is so controlled that the substrate temperature may be not higher than 400° C. In forming the second composition hard coating film, it may be unnecessary to control the substrate temperature to 400° C. or lower; however, special attention should be paid so that the substrate temperature in the initial stage in the film formation of the first composition hard coating film could be not higher than 400° C. Oxygen adhering to the target surface may be taken into the film, and therefore, it is desirable to clean the target surface by preliminary discharging. Combining the temperature control and the preliminary discharging is more preferred. Since the first composition hard coating film may readily take oxygen thereinto in the initial stage of the film formation, the RF sputtering output power in the preliminary discharging is desirably a relatively high output power of from 500 W to 2500 W or so, and this may be effective for preventing the film from taking oxygen therein. According to the method as above, the requirement can be satisfied that the oxygen content in the range of the film of at least 500 nm from the interface is limited to a range of less than 5 atm. %.

In the invention, in the range of at least 500 nm from the interface of the first composition hard coating film that is in contact with the underlying layer toward the surface of the first composition hard coating film, the ratio of the peak area X of B—O to the peak area Y of B—N, X/Y, as obtained from the peak separation of the is orbit of B in X-ray photoelectric spectrometry, may satisfy $X/Y \leq 0.2$, thereby further bettering the adhesion strength of the film. The computation method is as follows: The peak of the is orbit of B is subjected to peak separation into the peak of B—O and that of B—N, and the individual peak areas X and Y are computed. Using the areas X and Y, the peak area ratio of B—O to B—N, X/Y is computed. In order that the ratio X/Y could be at most 0.2, it is important that the film does not take oxygen thereinto. Accordingly, for example, the film formation is attained with controlling the film-forming temperature, and it is necessary to control the film-forming temperature so that the substrate temperature could be not higher than 400° C. Oxygen adhering to the target surface may be taken into the film, and therefore, it is desirable to clean the target surface by preliminary discharging. Combining the temperature control and the preliminary discharging is more preferred. Since the first composition hard coating film may readily take oxygen thereinto in the initial stage of the film formation, the RF sputtering output power in the preliminary discharging is desirably a relatively high output power of from 500 W to 2500 W or so, and in the initial stage of the film formation after this, it is necessary that the film formation is initiated at a low output power of 100 W or so (the film-forming speed is not higher than 0.25 nm/hr).

The first composition hard coating film in the invention is represented by $Si_aB_bN_cC_dO_e$, comprising Si, B, C, N and O as the indispensable ingredients. B, C and N are the ingredients effective for increasing the hardness and improving the heat resistance and the lubricity of the hard coating film. O is the ingredient effective for improving the lubricity and the heat resistance of the film. The above-mentioned a, b, c, d and e satisfy $a+b+c+d+e=1$; and the Si content is $0.1 \leq a \leq 0.5$. When a is less than 0.1, then the effect of improving the heat resistance and increasing the hardness is insufficient. When a is more than 0.5, then the hardness lowers. The value b that indicates the B content is $0.01 \leq b \leq 0.2$. In case where the film does not contain B, then the hardness and the heat resistance of the film are insufficient, and the film is too brittle with the result that the film may be delaminated and its cutting performance could not be improved. Accordingly, b is at least 0.01 in the definition thereof mentioned above. B is effective for improving the lubricity characteristic of the film. However, B may readily react with oxygen, and therefore, if too much B is added to the film, it may worsen the film characteristics and the film adhesion strength. Accordingly, the amount of B is desirably the lowermost amount necessary for improving the film characteristics, and the uppermost limit of the amount is up to $b=0.2$. When $a+b+c+d+e=1$, more preferably $0.05<b<0.2$. Adding both Si and B to the film improves both the hardness and the heat resistance of the film. This is especially remarkable when Si exists as its boride. The value c that indicates the N content is $0.05 \leq c \leq 0.6$. When the film does not contain N, then the hardness and the heat resistance of the film could not be improved, and therefore as its definition, c is at least 0.05. If too much N is in the film, the Si—N bond in the film may increase to lower the hardness of the film. Accordingly, the uppermost limit of the amount of N is up to $c=0.6$. When $a+b+c+d+e=1$, more preferably $0.1<c<0.35$. The value d that indicates the C content is $0.1 \leq d \leq 0.7$. When the film does not contain C, then the hardness of the film is insufficient, and therefore as its definition, d is at least 0.1. If too much C is in the film, free carbon having a low hardness may exist in the film, thereby lowering the hardness of the film. Accordingly, the uppermost limit of the amount of C is up to $d=0.7$. When $a+b+c+d+e=1$ more preferably $0.15<d<0.4$. The content of O is $0<e \leq 0.2$. Many of the constitutive elements of the film readily take oxygen therein, and the film always contains oxygen as an impurity, and therefore as its definition, e is more than 0. Thus previously containing oxygen, oxygen diffusion in the film may be reduced in abrasive environments, and therefore the oxidation resistance of the film even at high temperatures may be improved. However, if too much oxygen is in the film, it may lower the hardness of the film. Accordingly, the uppermost limit of O is up to $e=0.2$. When $a+b+c+d+e=1$, more preferably $0.01<e<0.15$. In case where the film contains O to a high degree within the defined range, the O content profile in the film is preferably such that the oxygen content is the highest in the vicinity of the surface layer within a range of from the uppermost surface of the hard coating film toward a depth of less than 500 nm in the film thickness direction, from the viewpoint of the lubricity of the film in abrasive environments. Preferably, oxygen exists in the film as oxides of silicon (Si) and boron (B). In case where oxygen exists in the film as its solution solid, then it forms a Si oxide and a B oxide with the increase in the cutting temperature during cutting work. In this case, the components of the object being cut may diffuse inside the coating film, thereby causing film fusion, and the mechanical characteristics of the coating film may be thereby worsened. Accordingly, it is desirable that oxygen exists in the coating film as previously formed oxides.

As having good adhesiveness, the multilayer film-coated member of the invention can exhibit excellent abrasion resistance and heat resistance for a long period of time even in abrasive environments where the temperature rises owing to the increase in the cutting speed and to the increase in the hardness of the objects to be cut. The reason is described below. In the invention, the first composition hard coating film has extremely excellent heat resistance, and in environments where the temperature rises, it especially exhibits its effect. The main reason is because the first composition hard coating film has a low friction coefficient in high-temperature environments, and therefore it extremely reduces the thermal influence on the substrate. The reason why the friction coefficient of the film is especially low in high-temperature environments is because $SiO_2$ and $B_2O_3$ are formed in abrasive environments. In addition, $SiO_2$ and $B_2O_3$ form a liquid phase containing $SiO_2$ and $B_2O_3$ at a low temperature of 450° C. or so. For these reasons, when the multilayer film-coated member of the invention is for hard coating films for cutting tools, it improves the lubricative characteristics around the edges of the tools, thereby preventing the adhesion of work materials to the edges, and the stability of the edges is thereby improved. In case where the first composition hard coating film alone is used for coating a substrate, it is problematic in point of the adhesion strength to the substrate and the abrasion resistance in practical use. Accordingly, it is important that the first film is at least combined with the second composition hard coating film to be described below, or it is in the form of a multilayer hard coating film containing the second composition hard coating film. The multilayer film-coated member of the invention is a concept that contains an interlayer to be described below.

The main role of the second composition hard coating film in the invention is that it exists so that the first composition hard coating film may sufficiently exhibit its effect. As combined with the first composition hard coating film, the second composition hard coating film exhibits excellent adhesion strength and abrasion resistance in practical use. However, in case where the second composition hard coating film contains Si, its atomic ratio must be less than 0.5 to the metal element of 1.0, and thus, the second film is differentiated from the first composition hard coating film. The multilayer hard coating film that comprises the first composition hard coating film and the second composition hard coating film exhibits its effect of adhesion strength and abrasion resistance. The second composition hard coating film may have a double-layered structure of, for example, (TiAl)N/(TiSi)N as in FIG. 2. When the interlayer of (TiSi)N is provided between the first composition hard coating film and (AlTi)N, then the abrasion resistance and the adhesiveness of the multilayer film are much improved. As the case may be, the ratio of the first composition hard coating film to the overall multilayer hard coating film could not be increased from the viewpoint of the residual compression stress, and in such a case, the second composition hard coating film is made thick. A preferred thickness ratio of the first composition hard coating film and the second composition hard coating film is such that, when the overall thickness is considered 100, the ratio of the first composition hard coating film is from 2% to 50%. In order that the first composition hard coating film could sufficiently exhibit its characteristics, the adhesion strength of the second composition hard coating film to the substrate surface, and the hardness and the residual compression stress thereof are important factors. Especially preferred compositions of the second composition hard coating film are (AlTi)N, (AlCr)N, (AlCrSi)N, (TiSi)N, (AlTiSi)N, from the viewpoint of the adhesion strength to the substrate and the adhesion strength to the first composition hard coating film. Preferred compositions of the second composition hard coating film as combined with the interlayer are (TiAl)N/(TiSi)N, (AlCrSi)N/(TiSi)N, (TiAl)N/(CrSi)BN.

For producing the hard coating film in the invention, a sputtering method (hereinafter this may be referred to as "SP method") is effective that uses a composite target containing silicon carbide and boron nitride. In this case, a composite target containing silicon carbide and boron nitride is preferably used; however, silicon carbide and boron nitride may be put on different evaporation sources and they may be sputtered simultaneously to produce the intended object. For producing the multilayer film-coated member of the invention, it is desirable that the first composition hard coating film is formed according to an SP method, and the second composition hard coating film is formed according to an arc ion plating method (hereinafter this may be referred to as "AIP method") and/or an SP method. For example, in FIG. 1, it is important to improve the adhesion strength between the second composition hard coating film 3 and the substrate 2, and therefore an AIP method is suitable to the boundary between the second composition hard coating film 3 and the substrate 2. In other areas than the boundary, coating according to an SP method may be effective for improving the abrasion resistance. The SP method may be combined with an AIP method. The first composition hard coating film 4 may be coated according to an SP method. The power in the SP method and the AIP method for the coating may be a high-frequency power or a direct current power; but from the viewpoint of the stability in the coating process, the sputtering power source is preferably a high-frequency power. As a bias power source, a high-frequency bias power source is more preferred in consideration of the electronic conductivity of the hard coating film and the mechanical characteristics of the hard coating film.

In case where the multilayer coating film of the invention is applied to cutting tools, it may remarkably exhibit its effect and may improve the abrasion resistance of the tools even in severe abrasive environments.

The method for producing the multilayer film-coated member of the invention is described. FIG. 5 schematically shows the structure of coating machine 16 for carrying out the method of the invention. The coating machine 16 comprises a vacuum chamber 13, four types of coating sources 8, 9, 10 and 11 as targets, and their shutters 17, 18, 19 and 20. In this, 8 and 10 are RF-coating sources; and 9 and 11 are arc sources. The coating sources are individually shut off by the shutters 17, 18, 19 and 20. Thus acting independently of each other, the individual coating sources may be separately shut off. Accordingly, it is unnecessary to stop the coating sources during the coating operation. Argon as a process gas and $N_2$, $O_2$ and $C_2H_2$ as reaction gases are fed into the vacuum chamber 13, for which the chamber has a vapor duct 15 equipped with a switch. The substrate holder 14 is provided with a rotary mechanism, and this is connected to a DC bias power or RF bias power 12. One preferred embodiment of the operation and the coating mode with the coating device 16 in the coating method of the invention is described below.

(1) Cleaning:

A substrate 2 is set on a substrate holder 14, and then heated at 250° C. to 800° C. During this, the shutters of the sources are all shut. The substrate is ion-cleaned by applying a pulse bias voltage to the bias power source 12.

(2) Coating with Second Composition Hard Coating Film:

After the cleaning, the shutters 18 and 20 of the arc sources 9 and 11 are opened, and the second composition hard coating film is formed. The second composition hard coating film may be formed according to a DC-SP method or a DC-AIP method. The DC bias voltage to be applied during the film formation is preferably from about 10 V to 400 V. A bipolar pulse bias voltage may also be used. In this step, the frequency is, for example, within a range of from 0.1 kHz to 300 kHz, and the positive bias voltage is especially preferably within a range of from 3 V to 100 V. The pulse/pose ratio may be within a range of from 0.1 to 0.95. During the formation of the second composition hard coating film, the RF coating sources 8 and 10 are operated while the shutters 17 and 19 are shut. This is for the purpose of removing the impurities such as oxide from the target surface. The RF sputtering output is preferably a high output of from 500 W to 2500 W or so, as the process is effective. The formation of the second composition hard coating film is attained under heat at 250° C. to 800° C., like in the ion-cleaning step for the substrate; but in forming the first composition hard coating film, the substrate temperature must be controlled so as to be not higher than 400° C. Accordingly, temperature control is necessary during the formation of the second composition hard coating film so that the substrate temperature could not be over 400° C. during the formation of the first composition hard coating film. After the formation of the second composition hard coating film, the shutters 17 and 19 are opened, and the RF-coating sources 8 and 10 are simultaneously operated to start film formation.

(3) Coating with First Composition Hard Coating Film:

The first composition hard coating film, SiBNCO film is formed from the RF coating sources 8 and 10. For the RF coating sources 8 and 10, preferred is a SiC-BN target material. The outermost surface layer of the outer layer of the first composition hard coating film may contain oxygen by applying a process gas such as oxygen to the vacuum chamber 13 via the vapor duct 15. For example, when argon is used as the process gas in starting the formation of the first composition hard coating film and when a mixed gas of argon and oxygen is used as the process gas after a predetermined period of time, then the oxygen content may be varied in the formed film in such a manner that the inner layer has a small oxygen content and the outer layer has a large oxygen content. In such a case, it is desirable that the outer layer contains a larger amount of oxygen. The layer functions as a lubricative abrasion-resistant layer. The temperature in film formation must be so controlled that the substrate temperature during film formation is not higher than 400° C. from the viewpoint of the adhesiveness of the film. The first composition hard coating film may take much oxygen thereinto in the initial stage of film formation, and therefore, the coating target surface must be cleaned by preliminary discharging and the RF sputtering output power must be less than 2500 W in the initial stage of film formation at least up to a thickness of 5 nm from the interface to the underlayer. Preferably, the RF sputtering output power is 100 W or so (the film-forming speed is at most 0.25 nm/hr). After a predetermined period of time, it is desirable that the RF sputtering output power is gradually increased finally up to 5000 W or so.

The invention is described with reference to the following Examples.

EXAMPLES

This is for evaluating the film properties of the hard coating film in the invention. Using a cemented carbide having a Co content of from 3% by weight to less than 12% by weight, a hard coating film was formed according to the following coating method.

The first coating method comprises a first step of heating a tool at 500° C., a second step of ion cleaning for about 30 minutes by applying a pulse bias voltage having a negative voltage of 200 V, a positive voltage of 30 V, a frequency of 20 kHz and a pulse/pose 4 ratio of, a third step of coating with (AlTi)N by an arc source, a fourth step of coating with (AlTi)N by an arc source and washing the target surface by discharging the sputtering target while the shutter is shut, a fifth step of coating with SiBNCO by using a target having a molar blend ratio, BN/SiC of 1/3 in a mode of RF sputtering with an RF-coating source, and a sixth step of coating with SiBNCO by RF+DC by applying a DC bias having a negative voltage of 50 V, in addition to the RF bias. In this, the coating was attained through the above 1st to 6th steps. Finally, a laminate structure of (AlTi)N and SiBNCO laminated in that order was formed, and the film thickness was about 3 μm. In the RF sputtering, the temperature inside the chamber was so controlled that the tool temperature could be not higher than 400° C. The sample coated according to the first coating method is referred to as a sample 1 of the invention.

The second coating method is as follows: In RF sputtering, oxygen gas was used as the reaction gas, and the film formation was so controlled that the oxygen content within the range of 500 nm from the interface could be more than 5 atm. %. The sample coated according to the second coating method is referred to as a comparative sample 25. In the same manner but changing the flow rate and the flow time of the reaction gas, oxygen, a comparative sample 16 was produced.

The third coating method is as follows: In RF sputtering, used was a target having a molar blend ratio, BN/SiC of 1/1 as an RF coating source. The sample coated according to the third coating method is a comparative sample 18. The samples 2 to 10 and the samples 14 to 22 of the invention differ in the second composition hard coating film. In producing the samples 11 to 13 of the invention, nitrogen, oxygen or acetylene, respectively, was used as the reaction gas in forming the surface layer to be the outer layer of the SiBNCO film. In producing the sample 17 of the invention, the temperature inside the chamber was so controlled that the tool temperature could be not lower than 500° C.

The fourth coating method is as follows: A second composition hard coating film was formed according to a DC sputtering method, and the first composition hard coating film was formed according to an RF sputtering method. The samples produced according to the fourth coating method are referred to as samples 23 and 24 of the invention.

The details of the samples are shown in Tables 1, 2 and 3. In Table 1, an electron probe microanalyzer (EPMA) was used for analysis of film compositions. In Table 2, the film was analyzed in the depth direction through Auger electronic spectrometry (AES). The depth was computed on the basis of the etching rate of $SiO_2$.

Additional examples for second hard coating films can be found following Table 1.

TABLE 1

Constitution and Composition of Samples

| | Sample No. | Second composition coating film | First composition coating film | |
|---|---|---|---|---|
| | | | Inner | Outer |
| Invention | 1 | (Al0.6Ti0.4)N | — | Si(0.33)B(0.13)N(0.11)C(0.38)O(0.05) |
| | 2 | (Al0.6Ti0.4)N/(Ti0.8Si0.2)N | — | Si(0.32)B(0.12)N(0.12)C(0.39)O(0.05) |
| | 3 | (Al0.6Ti0.4)N/(Cr0.9Si0.1)BN | — | Si(0.29)B(0.14)N(0.13)C(0.38)O(0.06) |
| | 4 | (Al0.5Ti0.4Cr0.1)N | — | Si(0.28)B(0.14)N(0.14)C(0.40)O(0.04) |

TABLE 1-continued

Constitution and Composition of Samples

| | | | First composition coating film | |
|---|---|---|---|---|
| Sample No. | | Second composition coating film | Inner | Outer |
| | 5 | (Al0.5Ti0.4Nb0.1)N | — | Si(0.30)B(0.15)N(0.13)C(0.38)O(0.04) |
| | 6 | (Al0.5Ti0.4Si0.1)N | — | Si(0.32)B(0.14)N(0.15)C(0.35)O(0.04) |
| | 7 | (Al0.5Ti0.4W0.1)N | — | Si(0.31)B(0.13)N(0.14)C(0.38)O(0.04) |
| | 8 | (Al0.5Ti0.4W0.1)SN | — | Si(0.32)B(0.13)N(0.12)C(0.37)O(0.06) |
| | 9 | (Al0.7Cr0.3)N | — | Si(0.32)B(0.14)N(0.12)C(0.38)O(0.04) |
| | 10 | (Al0.6Cr0.3Si0.1)N | — | Si(0.33)B(0.11)N(0.12)C(0.38)O(0.06) |
| | 11 | (Al0.6Ti0.4)N | SiBNCO | Si(0.18)B(0.11)N(0.51)C(0.15)O(0.05) |
| | 12 | (Al0.6Ti0.4)N | SiBNCO | Si(0.43)B(0.10)N(0.11)C(0.25)O(0.11) |
| | 13 | (Al0.6Ti0.4)N | SiBNCO | Si(0.21)B(0.07)N(0.06)C(0.60)O(0.06) |
| | 14 | (Al0.6Ti0.4)N | — | Si(0.31)B(0.14)N(0.11)C(0.35)O(0.09) |
| | 15 | (Al0.5Ti0.5)ON | — | Si(0.31)B(0.15)N(0.13)C(0.37)O(0.04) |
| | 16 | (Ti0.9Nb0.1)CN | — | Si(0.30)B(0.13)N(0.12)C(0.40)O(0.05) |
| | 17 | (Ti0.8Si0.2)N | — | Si(0.29)B(0.14)N(0.15)C(0.38)O(0.04) |
| | 18 | (Ti0.9W0.1)N | — | Si(0.32)B(0.13)N(0.13)C(0.37)O(0.05) |
| | 19 | (Cr0.3Al0.6W0.1)N | — | Si(0.33)B(0.11)N(0.11)C(0.41)O(0.04) |
| | 20 | (Cr0.9Si0.1)BNO | — | Si(0.34)B(0.10)N(0.11)C(0.40)O(0.05) |
| | 21 | (Cr0.9Nb0.1)N | — | Si(0.31)B(0.14)N(0.13)C(0.38)O(0.04) |
| | 22 | (Cr0.9W0.1)CN | — | Si(0.29)B(0.13)N(0.11)C(0.41)O(0.06) |
| | 23 | (W0.4Si0.6)CN | — | Si(0.31)B(0.13)N(0.12)C(0.39)O(0.05) |
| | 24 | (Nb0.4Si0.6)CN | — | Si(0.30)B(0.14)N(0.13)C(0.36)O(0.07) |
| | 25 | (Al0.6Ti0.4)N | — | Si(0.29)B(0.16)N(0.14)C(0.37)O(0.04) |
| | 26 | (Ti0.9V0.1)N | — | Si(0.28)B(0.13)N(0.13)C(0.39)O(0.07) |
| | 27 | (Ti0.4Al0.5Mo0.1)N | — | Si(0.29)B(0.13)N(0.13)C(0.40)O(0.05) |
| | 28 | (Ti0.9Zr0.1)N | — | Si(0.27)B(0.16)N(0.14)C(0.39)O(0.04) |
| | 29 | (Ti0.4Al0.5V0.1)N | — | Si(0.30)B(0.14)N(0.13)C(0.37)O(0.06) |
| | 30 | (Ti0.7Si0.2Nb0.1)N | — | Si(0.32)B(0.13)N(0.14)C(0.38)O(0.03) |
| | 31 | (Ti0.7Si0.2V0.1)N | — | Si(0.31)B(0.13)N(0.15)C(0.37)O(0.04) |
| | 32 | (Al0.6Cr0.3Nb0.1)N | — | Si(0.30)B(0.14)N(0.15)C(0.36)O(0.05) |
| | 33 | (Al0.6Cr0.3V0.1)N | — | Si(0.31)B(0.15)N(0.14)C(0.36)O(0.04) |
| | 34 | (Al0.6Cr0.3Si0.1)N/[Ti0.8Si0.2)N | — | Si(0.32)B(0.14)N(0.13)C(0.36)O(0.05) |
| | 35 | (Al0.5Ti0.4Si0.1)N/[Ti0.8Si0.2)N | — | Si(0.33)B(0.13)N(0.12)C(0.37)O(0.05) |
| Comparison | 36 | (Al0.6Ti0.4)N | — | Si(0.29)B(0.16)N(0.14)C(0.32)O(0.09) |
| | 37 | (Al0.6Ti0.3)N | — | Si(0.32)B(0.14)N(0.10)C(0.33)O(0.10) |
| Convention | 38 | (Al0.6Ti0.4)N | — | Si(0.22)B(0.11)N(0.12)C(0.50)O(0.05) |
| | 39 | (Al0.6Ti0.4)N | — | Si(0.24)B(0.21)N(0.21)C(0.22)O(0.12) |

In addition to the example of Table 1, a second composition hard coating film may also include Ni, Ce, or Mg forming among others for example chemical compositions like $Ti_aSi_bCe_c$, in particular for example $Ti_{0.9}Si_{0.09}Ce_{0.01}N$ or $Al_{0.66}Cr_{0.30}Mg_{0.02}Si_{0.02}N$ or $Cr_{0.84}Ni_{0.1}B_{0.05}Si_{0.01}$.

TABLE 2

Oxygen Content (atm. %) Profile from Interface in Sample

| | | Distance from interface (nm) | | | | | | | | | |
|---|---|---|---|---|---|---|---|---|---|---|---|
| Sample No | | 0 | 25 | 100 | 200 | 300 | 400 | 500 | 600 | 700 | 800 | 900 |
| Invention | 1 | 2.6 | 3.0 | 2.9 | 2.7 | 2.3 | 2.2 | 2.2 | 2.2 | 2.1 | 2.1 | 2.1 |
| | 2 | 2.8 | 2.9 | 2.9 | 2.8 | 2.6 | 2.5 | 2.5 | 2.4 | 2.4 | 2.4 | 2.4 |
| | 3 | 2.8 | 2.8 | 2.8 | 2.7 | 2.8 | 2.7 | 2.7 | 2.6 | 2.6 | 2.6 | 2.6 |
| | 4 | 2.7 | 2.8 | 2.7 | 2.6 | 2.7 | 2.7 | 2.6 | 2.6 | 2.5 | 2.5 | 2.5 |
| | 5 | 2.8 | 2.9 | 2.9 | 2.8 | 2.7 | 2.7 | 2.7 | 2.6 | 2.6 | 2.6 | 2.7 |
| | 6 | 2.7 | 2.8 | 2.8 | 2.9 | 2.8 | 2.7 | 2.8 | 2.8 | 2.7 | 2.7 | 2.6 |
| | 7 | 2.9 | 3.0 | 3.0 | 2.9 | 2.9 | 2.8 | 2.8 | 2.7 | 2.6 | 2.6 | 2.7 |
| | 8 | 2.8 | 2.9 | 2.8 | 2.9 | 2.7 | 2.7 | 2.7 | 2.6 | 2.5 | 2.5 | |
| | 9 | 2.6 | 2.8 | 2.8 | 2.8 | 2.7 | 2.7 | 2.6 | 2.6 | 2.6 | 2.6 | 2.5 |
| | 10 | 2.7 | 2.7 | 2.8 | 2.6 | 2.5 | 2.5 | 2.5 | 2.5 | 2.4 | 2.4 | 2.4 |
| | 11 | 2.8 | 2.8 | 2.9 | 2.8 | 2.8 | 2.7 | 2.7 | 2.5 | 2.4 | 2.3 | 2.3 |
| | 12 | 3.0 | 3.1 | 3.1 | 3.0 | 2.8 | 2.8 | 2.8 | 2.7 | 2.9 | 3.5 | 5.6 |
| | 13 | 2.9 | 2.9 | 3.0 | 3.1 | 2.9 | 2.9 | 2.9 | 2.4 | 2.3 | 2.2 | 2.2 |
| | 14 | 3.4 | 3.2 | 3.2 | 3.1 | 3.2 | 3.2 | 3.2 | 4.5 | 5.7 | 6.4 | 6.9 |
| | 15 | 3.0 | 3.1 | 3.1 | 2.9 | 2.8 | 2.8 | 2.8 | 2.8 | 2.8 | 2.7 | 2.7 |
| | 16 | 2.9 | 2.9 | 2.8 | 2.9 | 2.9 | 2.8 | 2.7 | 2.8 | 2.7 | 2.6 | 2.6 |
| | 17 | 3.1 | 3.2 | 3.1 | 2.9 | 2.8 | 2.9 | 2.8 | 2.8 | 2.8 | 2.8 | 2.8 |
| | 18 | 2.9 | 3.0 | 3.0 | 2.9 | 2.9 | 2.8 | 2.8 | 2.8 | 2.9 | 2.7 | 2.7 |
| | 19 | 3.2 | 3.2 | 3.1 | 3.2 | 3.0 | 2.9 | 2.9 | 2.9 | 2.9 | 2.8 | 2.8 |
| | 20 | 3.0 | 3.1 | 3.1 | 3.0 | 2.9 | 2.9 | 2.9 | 2.8 | 2.9 | 2.9 | 2.8 |
| | 21 | 2.9 | 2.9 | 2.8 | 2.9 | 2.8 | 2.8 | 2.8 | 2.7 | 2.7 | 2.7 | 2.7 |

TABLE 2-continued

Oxygen Content (atm. %) Profile from Interface in Sample

| | Sample No | \multicolumn{11}{c}{Distance from interface (nm)} |
| --- | --- | --- | --- | --- | --- | --- | --- | --- | --- | --- | --- | --- |
| | | 0 | 25 | 100 | 200 | 300 | 400 | 500 | 600 | 700 | 800 | 900 |
| | 22 | 3.1 | 3.0 | 3.0 | 3.1 | 2.9 | 2.9 | 2.9 | 2.9 | 2.8 | 2.9 | 2.7 |
| | 23 | 3.0 | 2.9 | 2.9 | 2.9 | 2.9 | 2.8 | 2.7 | 2.7 | 2.7 | 2.7 | 2.7 |
| | 24 | 2.9 | 3.0 | 3.0 | 3.1 | 2.9 | 2.9 | 2.8 | 2.7 | 2.7 | 2.7 | 2.7 |
| | 25 | 3.3 | 3.3 | 3.1 | 3.1 | 2.8 | 2.8 | | | | | |
| | 26 | 3.1 | 3.2 | 3.0 | 2.9 | 2.9 | 2.8 | 2.8 | 2.8 | 2.8 | 2.8 | 2.7 |
| | 27 | 2.9 | 2.9 | 2.8 | 2.8 | 2.7 | 2.7 | 2.7 | 2.8 | 2.7 | 2.7 | 2.7 |
| | 28 | 3.0 | 3.2 | 3.1 | 3.0 | 3.0 | 3.0 | 2.9 | 2.9 | 2.9 | 2.9 | 2.9 |
| | 29 | 3.2 | 3.1 | 3.1 | 3.1 | 3.1 | 3.1 | 3.0 | 3.0 | 3.0 | 3.0 | 3.0 |
| | 30 | 2.8 | 2.9 | 2.8 | 2.8 | 2.8 | 2.8 | 2.8 | 2.8 | 2.8 | 2.8 | 2.8 |
| | 31 | 2.9 | 2.9 | 2.9 | 2.8 | 2.7 | 2.6 | 2.6 | 2.6 | 2.6 | 2.7 | 2.6 |
| | 32 | 2.8 | 2.8 | 2.7 | 2.7 | 2.6 | 2.5 | 2.5 | 2.6 | 2.5 | 2.5 | 2.5 |
| | 33 | 3.1 | 3.2 | 3.1 | 3.0 | 3.0 | 2.9 | 2.9 | 2.9 | 2.9 | 2.9 | 2.9 |
| | 34 | 3.0 | 3.0 | 2.9 | 2.9 | 2.9 | 2.9 | 2.8 | 2.8 | 2.8 | 2.7 | 2.6 |
| | 35 | 2.6 | 2.7 | 2.8 | 2.8 | 2.8 | 2.8 | 2.7 | 2.7 | 2.7 | 2.7 | 2.7 |
| Comparison | 36 | 6.5 | 6.8 | 6.9 | 7.0 | 7.2 | 5.3 | 3.6 | 2.8 | 2.5 | 2.4 | 2.3 |
| | 37 | 5.4 | 5.5 | 5.6 | 5.7 | 5.8 | 5.5 | 4.8 | 4.5 | 4.2 | 4.2 | 4.2 |
| Convention | 38 | 6.2 | 6.3 | 6.3 | 6.3 | 6.5 | 6.5 | 6.4 | 6.4 | 6.4 | 6.5 | 6.5 |
| | 39 | 9.5 | 9.6 | 9.7 | 9.7 | 9.8 | 9.7 | 9.7 | 9.7 | 9.7 | 9.6 | 9.7 (at %) |

TABLE 3

Test Results of Samples

| | Sample No | Adhesion strength | X/Y |
| --- | --- | --- | --- |
| Invention | 1 | A | 0.148 |
| | 2 | A | 0.146 |
| | 3 | A | 0.152 |
| | 4 | A | 0.154 |
| | 5 | A | 0.151 |
| | 6 | A | 0.149 |
| | 7 | A | 0.150 |
| | 8 | A | 0.146 |
| | 9 | A | 0.154 |
| | 10 | A | 0.153 |
| | 11 | A | 0.124 |
| | 12 | A | 0.176 |
| | 13 | A | 0.104 |
| | 14 | A | 0.164 |
| | 15 | A | 0.153 |
| | 16 | A | 0.147 |
| | 17 | A | 0.149 |
| | 18 | A | 0.154 |
| | 19 | A | 0.151 |
| | 20 | A | 0.153 |
| | 21 | A | 0.154 |
| | 22 | A | 0.154 |
| | 23 | A | 0.146 |
| | 24 | A | 0.149 |
| | 25 | A | 0.153 |
| | 26 | A | 0.145 |
| | 27 | A | 0.139 |
| | 28 | A | 0.157 |
| | 29 | A | 0.162 |
| | 30 | A | 0.146 |
| | 31 | A | 0.142 |
| | 32 | A | 0.158 |
| | 33 | A | 0.129 |
| | 34 | A | 0.136 |
| | 35 | A | 0.146 |
| Comparison | 36 | D | 0.248 |
| | 37 | C | 0.234 |
| Convention | 38 | D | 0.254 |
| | 39 | D | 0.278 |

Regarding the chemical compositions of the second composition hard coating films as disclosed both in the description and in the claims of the present patent application, in particular as presented in the left column of Table 1, the convention concerning the system of notation of the chemical formulae is understood as follows: the chemical elements are subdivided into two groups of chemical elements. Group G consists of chemical elements $G^i$, which are B, N, O, C, or S. Group M consists of all other chemical elements $M^i$ used in the second composition hard coating layer. That is group M includes in particular the chemical elements $M^i$ which are Al, Ti, Cr, Ni, Ce, Mg, Nb, W, Si, V, Zr and Mo. Regarding this, all chemical formulae characterizing the composition hard coating film have the following form:

$$(\text{Group } M \text{ elements } M^i_{yi})_X (\text{Group } G \text{ elements } G^i)_{1-X}$$

with $$\sum_{i=1}^{n} yi = 100\%$$

and $$0.4 < X < 0.6$$

For example Sample No. 20 according to Table 1 is characterized by the chemical formula:

$$(Cr_{0.9}Si_{0.1})BNO$$

consisting of the group M elements $M^i$ which are in this example Cr and Si and further consisting of group G elements $G^i$ which are in the present example of sample No. 20 B, N, and O wherein $(Cr_{0.9}Si_{0.1})BNO$ in the scope of the present invention means $$(Cr_{0.9}Si_{0.1})_X(BNO)_{1-X}$$

with 0.4<X<0.6,
as generally defined above by the expression $$(\text{Group M elements})_X(\text{Group G elements})_{1-X}$$

with 0.4<X<0.6.

For evaluating the adhesion strength of the coating film of the invention, the film surface of Examples, Comparative Examples and Conventional Examples was tested according to a Rockwell dent test (pressure probe: Rockwell C scale, pressing load: 150 kgf), and from the condition of the coating film around the dented area, the samples were evaluated for the adhesiveness according to the following criteria.

A: No defect was found around the dented area.
B: Some defect such as peeling was found in a range of from the entire periphery to ½ around the dented area.
C: Some defect such as peeling was found in a range of from the entire periphery to ¾ around the dented area.
D: Some defect such as peeling was found in the entire periphery around the dented area.

The results are shown in Table 3 as four ranks of from A to D. The adhesion strength is A>B>C>D; and A is the best.

From the test results of the adhesion strength, the samples 1 to 24 of the invention had good adhesion strength. The samples 2 and 9 of the invention differ from the sample 1 of the invention in point of the composition of the second composition hard coating film. The sample 12 of the invention was formed with adding oxygen as the reaction gas in forming the surface layer of the first composition hard coating film. In this, no oxygen was used in forming the interface and around it, in which the oxygen content was controlled, therefore having no influence on the adhesiveness. In the sample 14 of the invention, the oxygen content within the range of from the interface to 600 nm is not more than 5 atm. %, and the oxygen content in the range of 700 nm or more is over 5 atm. %; but the adhesion strength is good. From this, it is known that, when the oxygen content at least within a range of from the interface to 500 nm is not more than 5 atm. %, then the oxygen content in the other area has no problem. In the comparative sample 25, the oxygen content in a range of from the interface to 400 nm is more than 5 atm. %, and the oxygen content in a range of 500 nm or more is not more than 5 atm. %; but the adhesion strength is not good. It is known that, when the oxygen content within a range of from the interface to 500 nm is more than 5 atm % even once, the adhesion strength is not good. In the comparative sample 26, the oxygen content in a range of from the interface to 500 nm is slightly more than 5 atm. %, and therefore, the adhesion strength is not good. In the comparative samples 27 and 28, the oxygen content is more than 5 atm. % within the entire region, and therefore the adhesion strength is not good. From these results, it is confirmed that the specific limitation of the oxygen content in the first composition hard coating film within a range of at least 500 nm from the interface of the first composition hard coating film on the side of the substrate, to less than 5 atm. % improves the adhesion strength.

Table 3 shows the ratio of the B—O peak area X to the B—N peak area Y. X/Y, as obtained from the peak separation of the is orbit of B in X-ray photoelectric spectrometry. The comparative samples 25 and 26 and the conventional samples 27 and 28 do not satisfy X/Y≦0.2, and contain a large quantity of B oxide, and therefore their adhesion strength is insufficient. In the Rockwell dent test, the samples showed film peeling. On the other hand, the samples of the invention all satisfy X/Y≦0.2 and B oxide is reduced therein, and therefore, the samples have sufficient adhesion strength and did not show film peeling.

Finally, by FIG. 6 a preferred embodiment of a multi layer film-coated member according to the invention is shown which is very important in practice. Regarding the special embodiment of FIG. 6, a second composition hard coating film 3 was deposited onto the substrate 2 using an arc coating technique. The thickness of this second composition hard coating film is between 0.5 μm and 10 μm and is preferably about 1 μm.

As an intermediate layer, an alternating sequence of first composition hard coating layers 4 and second composition hard coating 3 layers was then coated onto the second composition hard coating film 3 as which was first directly coated onto the substrate 2. The thickness of a single layer of the sequence of the first and second composition hard coating films 3,4 is between 2.5 nm and 100 nm, wherein the sequence of the first and the second composition hard coating films 3,4 may comprise a considerable number of single layers, for example up to 10 layers, or up to 50 to 100 layers or up to 1000 layers or in special cases more than 1000 single layers. Accordingly the thickness of the entire sequence of single layers is for example between 0.5 μm and 10 μm and is in a special embodiment of the present invention about 1 μm.

On top of the sequence of the plurality of alternating single hard coating films 3,4, a sequence of a plurality of different first composition hard coating films 4 is provided as a top layer. The entire thickness of the sequence of different first composition hard coating films 4 can be between 10 nm and 2000 nm, preferably between 20 nm and 100 nm. The thickness of a single first composition hard coating film 4 of the top layer is preferably between 2 nm and 100 nm. The single layers of first composition hard coating films 4 of the top layer may differ with respect to their chemical composition, for example with respect to the oxygen content or an other chemical component. That is the a/b ratio and or the x/y ratio may vary from one single first composition hard coating film 4 to another one.

Accordingly, the chemical composition of the first composition hard coating films of the intermediate layers and the chemical composition of the second composition hard coating films 3 may vary from one single layer of the intermediate layer to another one. For example, one single second composition hard 3 coating film may be a TiSiCeN-film 3 and another single second composition hard coating film 3 can be a AlCoSN-film 3.

Preferably, the first composition hard coating films 4 are deposited by using a sputter process wherein the second composition hard coating films 3 are produced using an arc technique.

Explanation to the Reference Numbers in the Figures:
1—Multilayer coating film
2—Substrate
3—Second composition hard coating film
4—First composition hard coating film
5—range is limited to a range of less than 5 atm %
6—Interface
7—$B_2O_3$—$SiO_2$ binary phase diagram
8—RF coating source
9—Arc source
10—RF coating source
11—Arc source
12—DC bias power/RF bias power
13—Vacuum chamber
14—Substrate holder
15—Vapor duct
16—Coating machine
17—Shutter
18—Shutter
19—Shutter
20—Shutter

What is claimed is:
1. A multilayer film-coated member fabricated by coating the surface of a substrate with at least two hard coating films having different compositions, wherein the first composition hard film of the outermost layer of the hard coating films represented by $Si_aB_bN_cC_dO_e$ with $a+b+c+d+e=1$, $0.1\leq a\leq 0.5$, $0.01\leq b\leq 0.2$, $0.05\leq c\leq 0.6$, $0.1\leq d\leq 0.7$ and $0<e\leq 0.2$, the second composition hard coating film of the lower layer below the first composition hard coating film is a hard film having at least two selected from Al, Ti, Cr, Ni, Ce, Mg, Nb, W, Si, V, Zr and Mo and N and at least one selected from B, C, O and S and the oxygen content of the film within a range of at least 25 nm from the interface of the first composition hard coating film that is in contact with the underlying layer toward the surface of the first composition hard coating film is limited to a range of less than 3.5 atm. %.

2. The multilayer film-coated member as claimed in claim 1, wherein the oxygen content of the film within a range of at least 100 nm, from the interface of the first composition hard coating film that is in contact with the underlying layer toward the surface of the first composition hard coating film is limited to a range of less than 4 atm. %.

3. The multilayer film-coated member as claimed in claim 1, wherein the ratio of the peak area X of B—O to the peak area Y of B—N, X/Y, as obtained from the peak separation of the 1s orbit of B in X-ray photoelectric spectrometry, is $X/Y \leq 0.2$, within a range of at least 500 nm from the interface of the first composition hard coating film that is in contact with the underlying layer toward the surface of the first composition hard coating film.

4. The multilayer film-coated member as claimed in claim 1, wherein the thickness of the second composition hard coating film is from 100 nm to less than 5000 nm.

5. The multilayer film-coated member as claimed in claim 1, wherein the thickness of the first composition hard coating film is from 10 nm to less than 1000 nm.

6. The multilayer film-coated member as claimed in claim 1, wherein when the overall thickness is considered 100, the ratio of the first composition hard coating film is from 2% to 50%.

7. The multilayer film-coated member as claimed in claim 1, wherein $0.05<b<0.2$.

8. The multilayer film-coated member as claimed in claim 1, wherein $0.1<c<0.35$.

9. The multilayer film-coated member as claimed in Previously presented claim 1, wherein $0.15<d<0.4$.

10. The multilayer film-coated member as claimed in claim 1, wherein $0.01<e<0.15$.

11. The multilayer film-coated member as claimed in claim 1, wherein the second composition hard coating film has a double-layered structure, in particular (TiAl)N/(TiSi)N.

12. The multilayer film-coated member as claimed in claim 1, wherein the composition of the second composition hard coating film is (AlTi)N and/or (AlCr)N and/or (AlCrSi)N and/or (TiSi)N and/or (AlTiSi)N, in particular in order to improve the adhesion strength to the substrate and/or to the first composition hard coating film.

13. The multilayer film-coated member as claimed in claim 1, wherein in combination with an interlayer, a composition of the second composition hard coating film is (AlCrSi)N/(TiSi)N and/or (TiAl)N/CrSi)BN.

14. A method for producing a multilayer film-coated member in accordance with claim 1, wherein the first composition hard coating film is formed under temperature control to keep the substrate temperature not higher than 400° C., and after the coating target surface is cleaned through preliminary discharging, the film is formed at a sputtering output power of less than 2500 W up to a thickness of at least 5 nm from the interface to the underlying layer, wherein in particular a high power sputtering process is used.

15. A cutting tool, a mold and a combustion engine or a member requiring heat resistance and abrasion resistance for airplanes, ground turbines, engines, gaskets, gears, pistons having a multilayer film-coated member as claimed in claim 1.

* * * * *